US009508716B2

(12) United States Patent
Lin et al.

(10) Patent No.: US 9,508,716 B2
(45) Date of Patent: Nov. 29, 2016

(54) METHODS OF MANUFACTURING A SEMICONDUCTOR DEVICE

(71) Applicant: Taiwan Semiconductor Manufacturing Company, Ltd., Hsin-Chu (TW)

(72) Inventors: Cheng-Tung Lin, Jhudong Township (TW); Teng-Chun Tsai, Hsin-Chu (TW); Li-Ting Wang, Tainan (TW); Chi-Yuan Chen, Hsin-Chu (TW); Kuo-Yin Lin, Jhubei (TW); Wan-Chun Pan, Hsin-Chu (TW); Ming-Liang Yen, New Taipei (TW); Ching-Wei Tsai, Taoyuan (TW); Kuo-Cheng Ching, Zhubei (TW); Huicheng Chang, Tainan (TW); Chih-Hao Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/861,247

(22) Filed: Apr. 11, 2013

(65) Prior Publication Data

US 2014/0273366 A1   Sep. 18, 2014

Related U.S. Application Data

(60) Provisional application No. 61/785,461, filed on Mar. 14, 2013.

(51) Int. Cl.
*H01L 21/8238* (2006.01)
*H01L 27/092* (2006.01)
(Continued)

(52) U.S. Cl.
CPC ....... *H01L 27/092* (2013.01); *H01L 21/28512* (2013.01); *H01L 21/28518* (2013.01);
(Continued)

(58) Field of Classification Search
CPC ............... H01L 21/823814; H01L 21/28518; H01L 21/76831; H01L 21/76843; H01L 27/092; H01L 27/0928; H01L 23/485
See application file for complete search history.

(56) References Cited

U.S. PATENT DOCUMENTS 5,593,924 A * 1/1997 Apte ................. H01L 21/28052
257/E21.165
5,744,395 A * 4/1998 Shue ................. H01L 21/28556
257/E21.17

(Continued)

FOREIGN PATENT DOCUMENTS

| CN | 102239546 A | 11/2011 |
| CN | 103915438 A | 7/2014 |

OTHER PUBLICATIONS

Connelly, Daniel, et al., "A New Route to Zero-Barrier Metal Source/Drain MOSFETs," IEEE Transactions on Nanotechnology, vol. 3, No. 1, Mar. 2004, pp. 98-104.

(Continued)

*Primary Examiner* — Mary Wilczewski
(74) *Attorney, Agent, or Firm* — Slater Matsil, LLP

(57) ABSTRACT

Semiconductor devices and methods of manufacture thereof are disclosed. In some embodiments, a method of manufacturing a semiconductor device includes providing a workpiece including an n-type field effect transistor (N-FET) region, a p-type FET (P-FET) region, and an insulating material disposed over the N-FET region and the P-FET region. The method includes patterning the insulating material to expose a portion of the N-FET region and a portion of the P-FET region, and forming an oxide layer over the exposed portion of the N-FET region and the exposed portion of the P-FET region. The oxide layer over the P-FET region is altered, and a metal layer is formed over a portion of the N-FET region and the P-FET region. The workpiece is annealed to form a metal-insulator-semiconductor (MIS) tunnel diode over the N-FET region and a silicide or germinide material over the P-FET region.

20 Claims, 5 Drawing Sheets

(51) Int. Cl.
*H01L 21/8234* (2006.01)
*H01L 27/06* (2006.01)
*H01L 27/088* (2006.01)
*H01L 21/285* (2006.01)
*H01L 23/485* (2006.01)
*H01L 21/768* (2006.01)
*H01L 21/8258* (2006.01)

(52) U.S. Cl.
CPC ... *H01L21/76814* (2013.01); *H01L 21/76831* (2013.01); *H01L 21/76843* (2013.01); *H01L 21/76855* (2013.01); *H01L 21/8258* (2013.01); *H01L 21/823418* (2013.01); *H01L 21/823814* (2013.01); *H01L 23/485* (2013.01); *H01L 27/0629* (2013.01); *H01L 27/088* (2013.01); *H01L 27/0928* (2013.01); *H01L 2924/0002* (2013.01)

(56) References Cited

U.S. PATENT DOCUMENTS

| | | | |
|---|---|---|---|
| 6,001,420 A * | 12/1999 | Mosely | H01L 21/76843 257/E21.585 |
| 6,184,083 B1 * | 2/2001 | Tsunashima et al. | 438/257 |
| 6,376,888 B1 * | 4/2002 | Tsunashima et al. | 257/407 |
| 6,727,129 B1 * | 4/2004 | Nakajima | 438/197 |
| 6,737,309 B2 * | 5/2004 | Matsuo | 438/199 |
| 6,762,085 B2 * | 7/2004 | Zheng | H01L 21/823814 257/E21.634 |
| 6,992,357 B2 * | 1/2006 | Matsuo et al. | 257/407 |
| 7,157,378 B2 * | 1/2007 | Brask et al. | 438/704 |
| 7,416,979 B2 * | 8/2008 | Yoon | H01L 21/28518 257/E21.165 |
| 7,485,936 B2 * | 2/2009 | Koyama et al. | 257/407 |
| 7,495,298 B2 * | 2/2009 | Hayashi et al. | 257/412 |
| 7,671,471 B2 * | 3/2010 | Brask et al. | 257/750 |
| 7,745,337 B2 * | 6/2010 | Farber | H01L 21/28052 257/E21.224 |
| 7,785,958 B2 * | 8/2010 | Doczy et al. | 438/240 |
| 8,039,381 B2 * | 10/2011 | Yeh et al. | 438/595 |
| 8,110,877 B2 | 2/2012 | Mukherjee et al. | |
| 8,536,681 B2 * | 9/2013 | Oji | H01L 21/823814 257/206 |
| 8,669,155 B2 * | 3/2014 | Yin et al. | 438/229 |
| 8,823,065 B2 * | 9/2014 | Wang | H01L 23/485 257/288 |
| 8,952,541 B2 * | 2/2015 | Mukherjee | H01L 21/28512 257/774 |
| 9,105,490 B2 * | 8/2015 | Wang | H01L 29/66636 |
| 9,165,838 B2 * | 10/2015 | Nieh | H01L 21/823871 |
| 9,240,480 B2 * | 1/2016 | Xu | H01L 29/41725 |
| 9,287,138 B2 * | 3/2016 | Wang | H01L 21/76856 |
| 9,390,939 B2 * | 7/2016 | Xie | H01L 21/32133 |
| 2002/0014634 A1 * | 2/2002 | Koyama et al. | 257/192 |
| 2006/0163670 A1 * | 7/2006 | Ellis-Monaghan | H01L 21/823814 257/388 |
| 2007/0275510 A1 * | 11/2007 | Chen et al. | 438/142 |
| 2008/0119019 A1 * | 5/2008 | Han | H01L 21/82380 438/197 |
| 2008/0145984 A1 * | 6/2008 | Ke | H01L 21/28518 438/197 |
| 2008/0211034 A1 * | 9/2008 | Tsuchiya et al. | 257/371 |
| 2010/0155846 A1 * | 6/2010 | Mukherjee | H01L 21/28512 257/365 |
| 2010/0255652 A1 * | 10/2010 | Tanioku | H01G 4/085 438/381 |
| 2011/0147855 A1 * | 6/2011 | Joshi | H01L 21/28518 257/384 |
| 2014/0183645 A1 * | 7/2014 | Wann | H01L 21/823814 257/369 |
| 2015/0270134 A1 * | 9/2015 | Xu | C23C 14/24 438/656 |

OTHER PUBLICATIONS

Hu, Jenny, et al., "Metal/III-V Effective Barrier Height Tuning Using Atomic Layer Deposition of High-k/High-k Bilayer Interfaces," Applied Physics Letters, 99, 092107, 2011, pp. 092107-1-092107-3.

Kobayashi, Masaharu, et al., "Fermi-Level Depinning in Metal/Ge Schottky Junction and Its Application to Metal Source/Drain Ge NMOSFET," Department of Electrical Engineering, Stanford University, 2 pages.

Lin, J.-Y. Jason, et al., "Increase in Current Density for Metal Contacts to n-Germanium by Inserting TiO2 Interfacial Layer to Reduce Schottky Barrier Height," Applied Physics Letters, 98, 092113, 2011, pp. 092113-1-092113-3.

Nishimura Tomonori, et al., "Evidence for Strong Fermi-Level Pinning Due to Metal-Induced Gap States at Metal/Germanium Interface," Applied Physics Letters, 91, 123123, 2007, pp. 123123-1-123123-3.

Yuan, Ze, et al., "Schottky Barrier Height Reduction for Metal/n-GaSb Contact by Inserting TiO2 Interfacial Layer with Low Tunneling Resistance," Applied Physics Letters, 98, 172106, 2011, pp. 172106-1-172106-3.

* cited by examiner

METHODS OF MANUFACTURING A SEMICONDUCTOR DEVICE

CROSS-REFERENCE TO RELATED APPLICATIONS

This application claims the benefit of U.S. Provisional Application No. 61/785,461 filed on Mar. 14, 2013, entitled, "Semiconductor Devices Including MIS Tunnel Diodes and Methods of Manufacture Thereof," which is incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

In some applications, a semiconductor device includes one or more p-type FETs (P-FETs) and one or more n-type FETs (N-FETs). P-FETs and N-FETs have different properties in some applications, and thus, a manufacturing process for P-FETs may vary from a manufacturing process for N-FETs, for example.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to manufacturing methods and structures for semiconductor devices. Illustrative embodiments described herein provide novel methods of forming Si, III-V, and Ge devices with a metal-insulator-semiconductor (MIS) tunnel diode and a silicide or germinide at the source and drain (S/D) regions. The MIS tunnel diode is formed at an N-FET for contact resistance ($R_{csd}$) reduction. The silicide or germinide is formed at a P-FET S/D region comprising SiGe or Ge.

Figure 1:
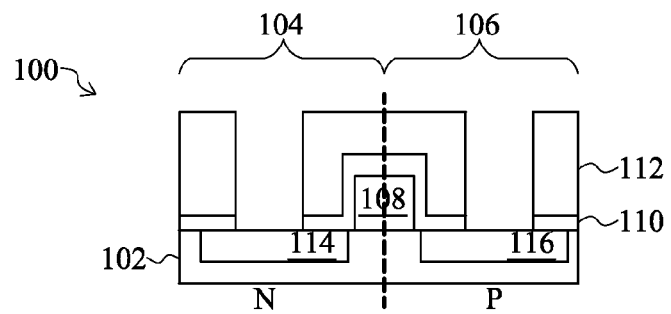
FIGS. 1 through 7 illustrate cross-sectional views of a semiconductor device at various stages of manufacturing in accordance with some embodiments of the present disclosure.

FIGS. 1 through 7 show cross-sectional views of a semiconductor device 100 at various stages of manufacturing in accordance with some embodiments. Referring first to FIG. 1, to manufacture the semiconductor device 100, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The workpiece 102 comprises a substrate having an N region 104 and a P region 106. The N region 104 is doped with an N-type (N+) doping material such as As, P, Sb, or a group V element, and the P region 106 is doped with a P-type (P+) doping material such as B, $BF_2$, Al, In, or a group III element in some embodiments, for example. Alternatively, the N region 104 and the P region 106 may be doped with other materials. The N region 104 includes a S/D region 114 comprising SiP and the P region 106 includes a S/D region 116 comprising SiGe in some embodiments. In other embodiments, the S/D region 116 of the P region 106 comprises Ge. In other embodiments, the S/D region 114 of the N region 104 comprises a III-V material, such as GaAs, InGaAs, or other III-V materials. The S/D regions 114 and 116 are formed using one or more implantation processes, deposition processes, epitaxial growth processes, or other methods, as examples.

The N region 104 comprises a region in which an N-FET device 134 (not shown in FIG. 1; see FIG. 7) will be formed, and the P region 106 comprises a region in which a P-FET device 136 (see FIG. 7) will be formed. The N region 104 is also referred to herein as an N-FET region, and the P region 106 is also referred to herein as a P-FET region, for example.

Referring again to FIG. 1, a metal gate (MG) 108 is formed over the workpiece 102 disposed between the S/D regions 114 and 116. The metal gate 108 comprises a self-aligned contact (SAC) in some embodiments. The metal gate 108 comprises a conductive material such as Al, Cu, TiAl, TiN, W, or combinations or multiple layers thereof, as examples. The metal gate 108 comprises a thickness or height of about 10 Å to about 100 Å, for example. Alternatively, the metal gate 108 may comprise other materials and dimensions. The metal gate 108 may comprise a gate of a transistor that is disposed over a channel region of the workpiece 102, for example. A gate dielectric (not shown)

comprising an insulating material is disposed between the metal gate 108 and the workpiece 102 in some embodiments.

A contact etch stop layer (CESL) 110 is formed over the metal gate 108 and the workpiece 102. The CESL 110 comprises an insulating material such as silicon nitride, silicon oxide, other insulators, or combinations or multiple layers thereof, as examples. The CESL 110 may comprise a thickness of about 30 Å to about 200 Å, for example. Alternatively, the CESL 110 may comprise other materials and dimensions. In some embodiments, the CESL 110 is not included on the semiconductor device 100.

An inter-layer dielectric (ILD) 112 is formed over the CESL 110, also shown in FIG. 1. The ILD 112 comprises an insulating material and may comprise a low dielectric constant (k) material having a dielectric constant less than a dielectric constant of silicon dioxide in some embodiments, for example. The ILD 112 comprises phosphosilicate glass (PSG) oxide, undoped silicate glass (USG) oxide, borophosphosilicate glass (PBSG) oxide, high density plasma (HDP) oxide, plasma enhanced (PE) oxide, flowable chemical vapor deposition (CVD) oxide, or combinations or multiple layers thereof in some embodiments, as examples. The ILD 112 comprises a thickness of about 300 Å to about 3,000 Å, for example. Alternatively, the ILD 112 may comprise other materials and dimensions.

The ILD 112 and CESL 110, if the CESL 110 is included, are patterned using a photolithography and etch process to expose a portion of the N-FET region 104 and a portion of the P-FET region 106. A portion of the S/D regions 114 and 116 of the N-FET region 104 and the P-FET region 106, respectively, are exposed in some embodiments. For example, a layer of photoresist (not shown) comprising a photosensitive material may be deposited over the ILD 112, and the layer of photoresist is patterned with a desired pattern using lithography, by exposing the layer of photoresist to light or energy reflected from or transmitted through a lithography mask (also not shown) having a desired pattern thereon. The layer of photoresist is developed, and exposed portions (or unexposed portions, depending on whether the layer of photoresist comprises a positive or negative photoresist) of the layer of photoresist are ashed or etched away. The patterned layer of photoresist is then used as an etch mask during an etch process while exposed portions of the ILD 112 and CESL 110 are etched away. The layer of photoresist is then removed, leaving the structure shown in FIG. 1.

The patterns in the ILD 112 and CESL 110 comprise contact patterns disposed over active areas of the semiconductor device 100. The patterns may comprise a circular, oval, square, rectangular, or other shape in a top view of the workpiece 102. A wet cleaning process is used to clean the bottom surface of the patterns in some embodiments, e.g., the top surfaces of the S/D regions 114 and 116 are cleaned. The cleaning process removes any remaining oxide left behind after the etch process used to form the contact patterns in the ILD 112 and CESL 110.

In some embodiments, a chemical oxide is then formed over the S/D regions 114 and 116 (not shown). The chemical oxide may be formed using deionized water+ozone ($DIO_3$), $NH_4OH+H_2O_2+H_2O$ (APM), or other methods. The chemical oxide comprises a thickness of about 10 Å or other dimensions. The chemical oxide is not formed in other embodiments. In some embodiments, a native oxide may reside on the S/D regions 114 and 116.

Figure 2:
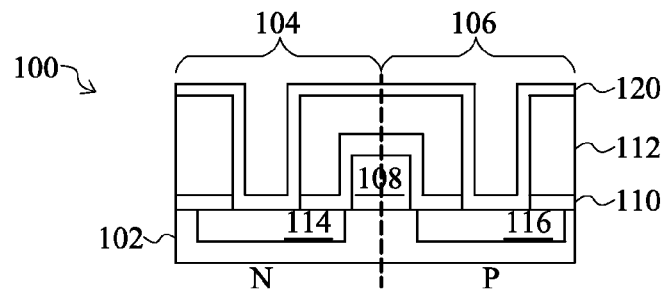

An oxide layer 120 is then formed over the patterned ILD 112 and CESL 110, as shown in FIG. 2. The oxide layer 120 is formed at least over the exposed portions of the N-FET region 104 and the P-FET region 106. The oxide layer 120 comprises $TiO_2$ in some embodiments. Alternatively, the oxide layer 120 may comprise other insulating materials. The oxide layer 120 comprises a thickness of about 5 Å to about 100 Å in some embodiments, for example. The oxide layer 120 may alternatively comprise other dimensions. In some embodiments, the oxide layer 120 is formed using physical vapor deposition (PVD), for example. Alternatively, the oxide layer 120 may be formed by atomic layer deposition (ALD) or other methods.

The oxide layer 120 comprises $TiO_2$ that is formed by depositing Ti combined with a vacuum oxidation in some embodiments. For example, the oxide layer 120 comprising $TiO_2$ may be formed by depositing Ti during a vacuum break induced oxidation process. A precursor of the Ti may be introduced during the oxidation process, such as tetrakis dimethylamino titanium (TDMAT), as an example. The oxide layer 120 comprising $TiO_2$ is formed over the native oxide or the chemical oxide on the S/D regions 114 and 116 in some embodiments. The oxide layer 120 may alternatively be formed using other methods and may comprise other insulating materials in other embodiments.

In accordance with some embodiments of the present disclosure, the oxide layer 120 is altered over the exposed portion of the P-FET region 106. In the embodiment shown in FIGS. 1 through 7, the oxide layer 120 is altered by removing the oxide layer 120 from over a portion of the exposed portion of the P-FET region 106. In other embodiments, the oxide layer 120 is altered in other ways, to be described further herein.

Figure 3:
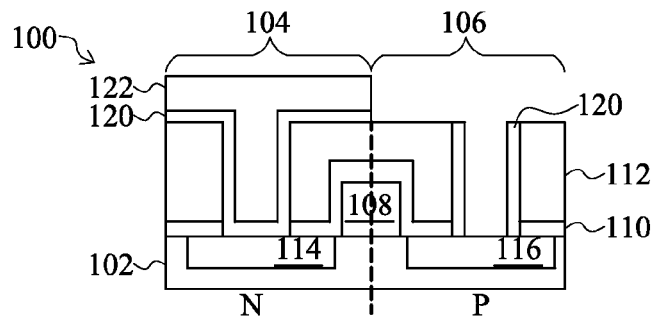

A layer of photoresist 122 is formed over the oxide layer 120, and the photoresist 122 is removed from over the P region 106 of the workpiece 102 using a photolithography process, as shown in FIG. 3. The photoresist 122 is removed from over a portion of the P-FET S/D region 116. A dry etch process or other etch process is used to remove the oxide layer 120 from the P-FET S/D region 116 using the layer of photoresist 122 as an etch mask in some embodiments. Portions of the oxide layer 120 may be left remaining on sidewalls of the patterned ILD 112 and CESL 110, as shown in FIG. 3. The oxide layer 120 is removed from only the top surface of the S/D region 116 and the top surface of the ILD 112 in the P-FET region 106 in some embodiments. The etch process to remove a portion of the oxide layer 120 comprises an anisotropic etch process that removes more of the oxide layer 120 from top surfaces than from sidewalls of the patterns in the ILD 112 and CESL 110 in some embodiments, for example.

Figure 4:
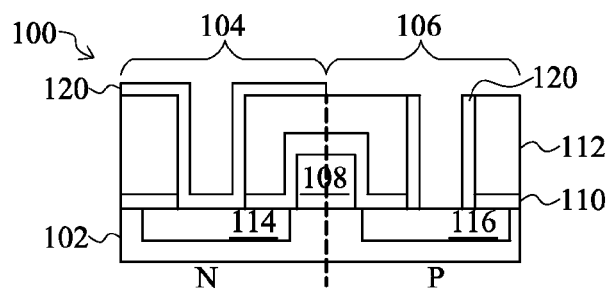

The layer of photoresist 122 is then removed using an ashing or etch process, as shown in FIG. 4. The semiconductor device 100 is then subjected to a bottom layer (BL) and wet cleaning (e.g., using DI water) process in some embodiments.

Figure 5:
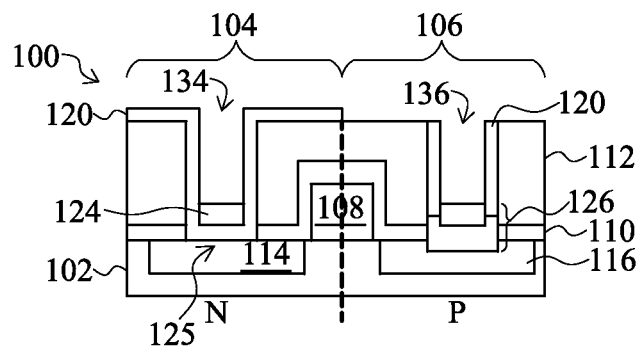

Referring next to FIG. 5, after a pre-cleaning step, a metal layer (not shown in FIG. 5; see metal layer 124 shown in FIG. 11) such as Ti/TiN is deposited over the oxide layer 120 and the ILD 112 in some embodiments, and the semiconductor device 100 is annealed to form a metal layer 124 and a silicide or germinide 126 over the S/D regions 114 and 116, respectively. The metal layer 124 is formed over the N-FET region 104 and the P-FET region 106 in some embodiments. The metal layer 124 comprises Ti/TiN in some embodiments. For example, the metal layer 124 may comprise a bi-layer of a first layer of Ti comprising a thickness of about 100 Å and a second layer of TiN comprising a thickness of about 15 Å. In some embodiments, the first layer of Ti comprises a thickness of about 5 Å to about 250 Å and the second layer of TiN comprises a thickness of about 5 Å to about 100 Å, for example. The Ti comprises a pad material and the TiN comprises a cap layer in some embodiments, for example. The metal layer 124 may alternatively comprise other materials and dimensions.

The anneal process may comprise a spike anneal at about 600 degrees C. in some embodiments. The anneal process may comprise a rapid thermal anneal (RTA) at a temperature of about 300 degrees C. to about 1,000 degrees C. for about 0.01 second to about 10 seconds, for example. The anneal process may comprise a millisecond (ms) anneal at a temperature of about 500 to about 1,200 degrees C. for about 1 to about 2.5 ms, as another example. Other types of anneal processes, temperatures, and anneal durations may also be used.

The anneal process forms a silicide or germinide 126 over the S/D region 116 in the P-FET region 106, and forms a metal comprising metal layer 124 of a MIS tunnel diode 125 over the S/D region 114 in the N-FET region 104. Forming the metal comprising the metal layer 124 of the MIS tunnel diode 125 comprises completing the formation of the MIS tunnel diode 125 in some embodiments, for example. The metal layer 124 of the MIS tunnel diode 125 comprises Ti/TiN, in some embodiments, for example. Alternatively, the metal layer 124 may comprise other materials.

In embodiments wherein the S/D region 116 of the P-FET region 106 comprises SiGe, a silicide 126 comprising TiSiGe is formed over the S/D region 116 of the P-FET region 106, for example. In embodiments wherein the S/D region 116 of the P-FET region 106 comprises Ge, a germinide 126 comprising TiGe is formed over the S/D region 116 of the P-FET region 106, for example. The P-FET 136 includes a Ti silicide or a Ti germinide 126 disposed over the S/D region 116 in some embodiments. Alternatively, the silicide or germinide 126 may comprise other materials.

The semiconductor device 100 includes an N-FET 134 formed in the N-FET region 104 that includes the MIS tunnel diode 125 disposed over the S/D region 114. The metal-insulator-semiconductor (MIS) tunnel diode 125 includes a metal comprising the metal layer 124, an insulator comprising the oxide layer 120, and a semiconductor comprising the S/D region 114. The semiconductor device 100 further includes a P-FET 136 formed in the P-FET region 106 that includes a silicide or germinide 126 disposed over the S/D region 116. The MIS tunnel diode 125 is formed at the N-FET 134 and the silicide or germinide 126 is formed at the P-FET 136 simultaneously during the anneal process. The silicide or germinide 126 advantageously lowers the contact resistance of the P-FET 136 S/D region 116. The silicide or germinide 126 consumes a top portion of the S/D region 116 of the P-FET 136 in some embodiments, as shown in FIGS. 5, 6, and 7.

Figure 6:
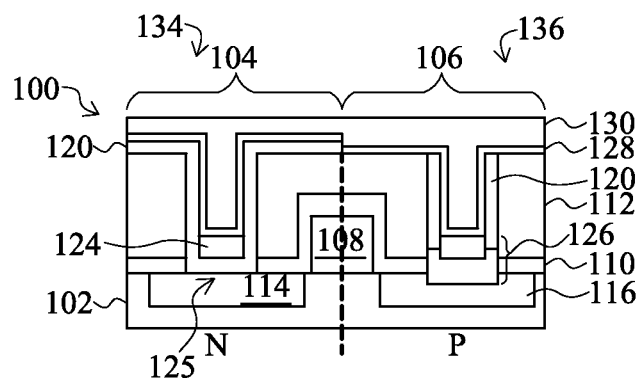
Figure 7:
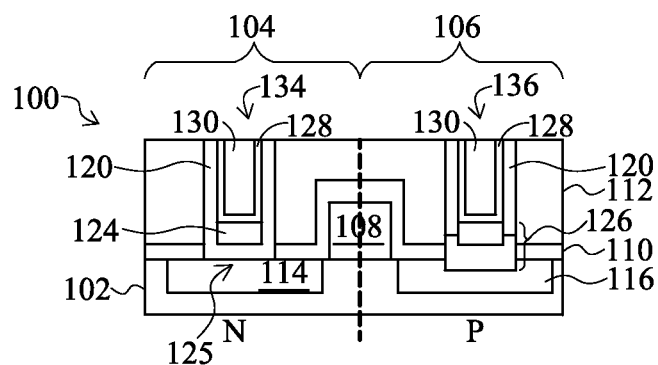

Contacts 128/130 are then formed within the patterned ILD 112 to make electrical connections to the S/D regions 114 and 116, as shown in FIGS. 6 and 7. In FIG. 6, a liner 128 is formed over the metal layer 124, the silicide or germinide 126, the oxide layer 120, and the ILD 112. The liner 128 comprises a glue layer of TiN comprising a thickness of about 5 Å to about 50 Å in some embodiments. Alternatively, the liner 128 may comprise other materials and dimensions. A conductive material 130 is formed over the liner 128, filling the patterns in the ILD 112. The conductive material 130 comprises W or a W alloy in some embodiments. Alternatively, other materials may be used. A chemical mechanical polish (CMP) process and/or etch process is used to remove the conducive material 130 and liner 128 from over the top surface of the ILD 112, leaving contacts 128/130 disposed over the N-FET 134 and the P-FET 136, as shown in FIG. 7. The oxide layer 120 disposed over the N-FET region 104 is also removed during the CMP or etch process in some embodiments, also shown in FIG. 7. The contacts 128/130 may alternatively comprise other materials and may be formed using other methods.

The contact 128/130 for the N-FET 134 is disposed within the ILD 112 and is coupled to the metal layer 124 of the MIS tunnel diode 125 disposed over the S/D region 114 of the N-FET 134. The contact 128/130 for the P-FET 136 is disposed within the ILD 112 and is coupled to the silicide or germinide 126 disposed over the S/D region 116 of the P-FET 136. The oxide layer 120 lines sidewalls of the contact 128/130 for the N-FET 134 in some embodiments, as shown in FIG. 7. For example, the oxide layer 120 lines the pattern of the contact 128/130 within the IDL 112 and CESL 110.

The manufacturing process flow for the semiconductor device 100 is then continued to complete the manufacturing process. For example, one or more metallization layers and insulating material layers (not shown) may be formed over the semiconductor device 100, which may include conductive lines and vias that provide electrical connections for the semiconductor device 100. The semiconductor device 100 is singulated along scribe lines to form a plurality of integrated circuits that include the novel N-FETs 134 and P-FETs 136 described herein.

An additional photolithography and etch step is used to form the semiconductor device 100 in the first manufacturing process flow illustrated FIGS. 1 through 7. FIGS. 8 through 13 show cross-sectional views of a semiconductor device 100 at various stages of manufacturing in accordance with other embodiments, wherein additional photolithography and etch steps are not required. The MIS tunnel diode 125 and silicide or germinide 126 are formed simultaneously at the N-FET 134 and the P-FET 136, respectively, and advantageously, no additional photolithography or etch steps are required in the manufacturing process flow.

Figure 8:
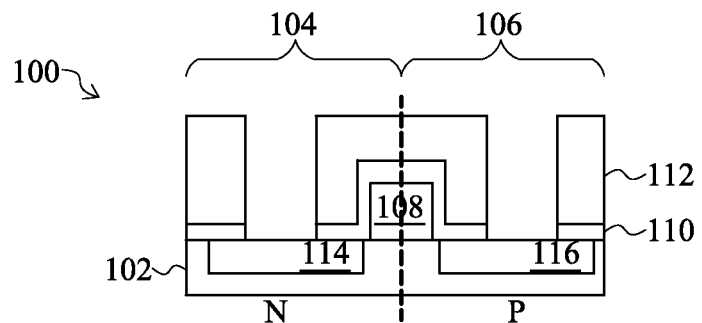
FIGS. 8 through 13 show cross-sectional views of a semiconductor device at various stages of manufacturing in accordance with other embodiments.

The manufacturing process flow shown in FIGS. 8 through 13 will next be described. In FIG. 8, a workpiece 102 is provided having an N region 104 and a P region 106 that include S/D regions 114 and 116, respectively. A metal gate 108 is disposed over the workpiece 102 between the N region 104 and P region 106, and a CESL 110 and ILD 112 are formed over the workpiece 102 and the metal gate 108, as described for FIG. 1. The ILD 112 and CESL 110 are patterned with a desired pattern for contacts. The patterns comprise contact patterns disposed over active areas of the semiconductor device 100. A wet cleaning process is used to clean the bottom surface of the patterns in some embodiments, e.g., the top surfaces of the S/D regions 114 and 116 are cleaned. The cleaning process removes any remaining oxide left behind after the etch process used to form the contact patterns.

Figure 9:
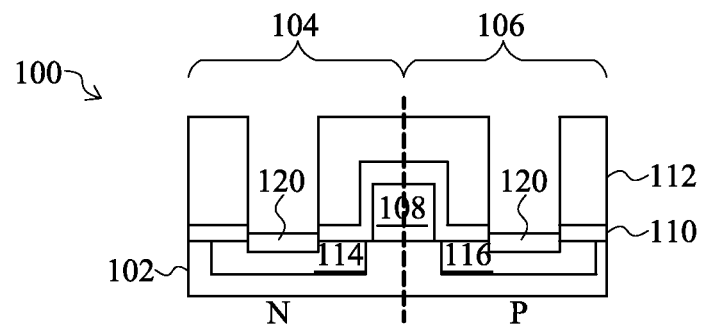

Referring next to FIG. 9, a plasma oxidation process, rapid thermal oxidation (RTO) process, in-situ steam generation (ISSG) process, or other oxide formation process is used to grow an oxide layer 120 having a thickness of about 25 Å on both the N-FET and P-FET S/D regions 114 and 116. The oxide layer 120 comprises a thickness of about 5 Å to about 100 Å in some embodiments. The oxide layer 120 comprises $TiO_2$ in some embodiments. In other embodiments, the oxide layer 120 comprises an oxide of a material of the S/D regions 114 and 116, respectively. For example, in embodiments wherein S/D region 114 comprises SiP, the oxide layer 120 over S/D region 114 comprises $SiPO_x$, and in embodiments wherein S/D region 116 comprises SiGe, the oxide layer 120 over S/D region 116 comprises $SiGeO_x$. In embodiments wherein S/D region 116 comprises Ge, the oxide layer 120 over the S/D region 116 comprises $GeO_x$, as another example. The oxide layer 120 is not formed on the ILD 112 or CESL 110 in some embodiments.

In some embodiments, the S/D region 114 of the N-FET region 104 comprises a first material, and the S/D region 116 of the P-FET region 106 comprises a second material, the second material being different than the first material. Forming the oxide layer 120 comprises forming a first oxide layer 120 comprising an oxide of the first material over the exposed portion of the N-FET region 104, and forming the oxide layer 120 further comprises forming a second oxide layer 120 comprising an oxide of the second material over the exposed portion of the P-FET region 106.

In some embodiments, the oxide layer 120 comprises $TiO_2$ formed by a thermal anneal of Ti on an oxide. For example, the oxide layer 120 may be formed by about 21 Å of oxide+about 100 Å of deposited Ti+a thermal anneal, resulting in the formation of an oxide layer 120 comprising $TiO_2$ in some embodiments.

Figure 10:
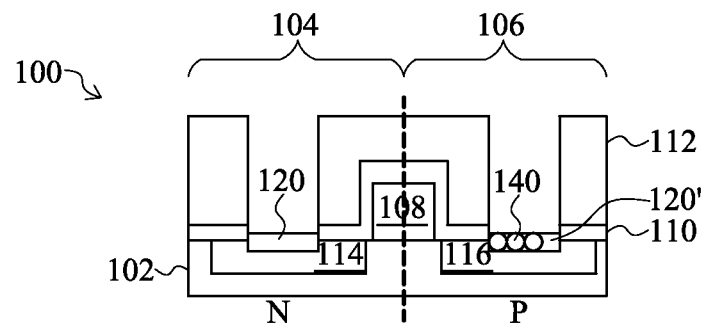

Referring next to FIG. 10, a wet cleaning process or other cleaning process is performed to alter the oxide layer 120 in the P-FET 136 S/D region 116. The wet cleaning process alters or damages the oxide layer 120 comprising $SiGeO_x$ or $GeO_x$ in the P-FET region 106 in some embodiments, for example. The wet cleaning process may comprise $H_2SO_4$+$H_2O_2$ (SPM), $DIO_3$, APM, $HCl+H_2O_2+H_2O$(HPM), or other chemicals or processes. The wet cleaning process damages the oxide layer 120 in the P region 106, creating a plurality of holes 140 within the oxide layer 120 material and forming a damaged oxide layer 120', as shown in FIG. 10. The holes 140 comprise void defects in some embodiments, for example. $SiGeO_x$ or $GeO_x$ comprise materials that are more easily damaged during a cleaning process, and thus, the oxide layer 120' of the P-FET region 106 is damaged, yet the oxide layer 120 of the N-FET region 104 is not damaged, or is damaged less than the oxide layer 120 of the P-FET region 106 is damaged, in some embodiments.

Figure 11:
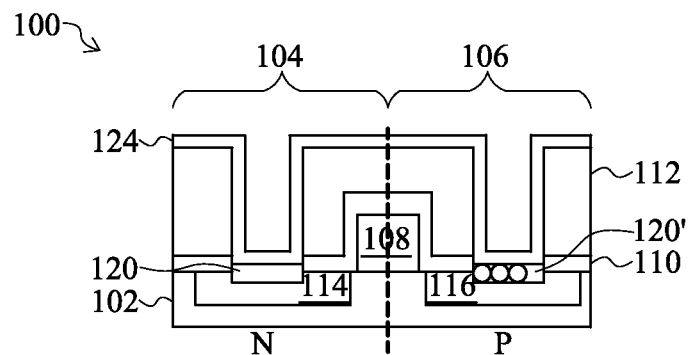
Figure 12:
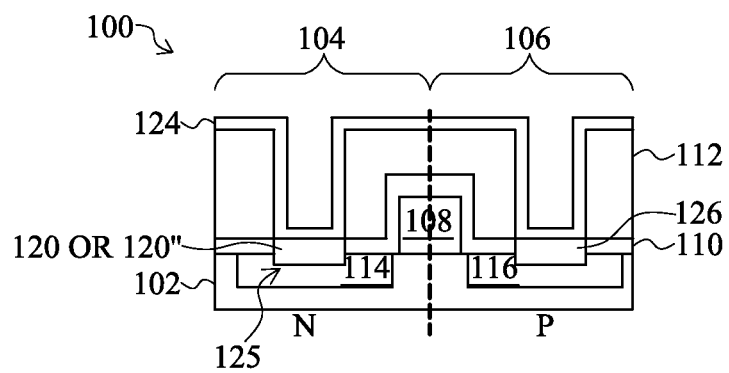
Figure 13:
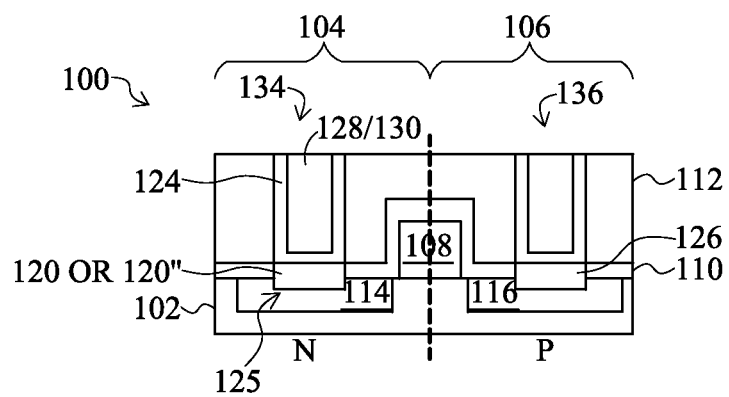

A metal layer 124 comprising Ti/TiN or other materials is deposited, as shown in FIG. 11. The metal layer 124 comprises a first layer of a Ti pad material and a second layer of a TiN cap material in some embodiments. A thermal anneal process is then used to simultaneously form an MIS tunnel diode 125 in the N-FET region 104 and a silicide or germinide comprising TiSiGe or TiGe in some embodiments at the P-FET region 106, as shown in FIG. 12. The MIS tunnel diode 125 includes a metal comprising the Ti pad of the metal layer 124 and an insulator comprising the $SiPO_x$, $TiO_2$, or other oxide material 120 in the N-FET region 104. The metal layer 124 comprising Ti/TiN is formed by similar deposition, anneal processes, and dimensions and processes as the manufacturing process flow described herein with respect to FIGS. 1 through 7 in some embodiments, for example. In some embodiments, layer 126 of the P-FET 136 disposed over the S/D region 116 comprises a germinide comprising $TiSiGe_x$ having a thickness of about 30 Å that is formed at a temperature of about 400 degrees C. over a time period of about 120 seconds, as an example. A TiN glue layer/W plug and W chemical mechanical polish (CMP) process or other conductive material fill process is used to fill the patterns in the ILD 112 and form conductive contacts 128/130 over the S/D regions 114 and 116 of the N-FET region 104 and P-FET region 106, respectively, as described for FIGS. 6 and 7, and as shown in FIG. 13.

The manufacturing process flow shown in FIGS. 8 through 13 advantageously utilizes a property of SiGe or Ge being easily affected by a wet cleaning process to simultaneously form a silicide or germinide at the P-FET 136 having a SiGe or Ge S/D region 116 while forming the MIS tunnel diode 125 at the N-FET 134 in some embodiments, for example.

Figure 14:
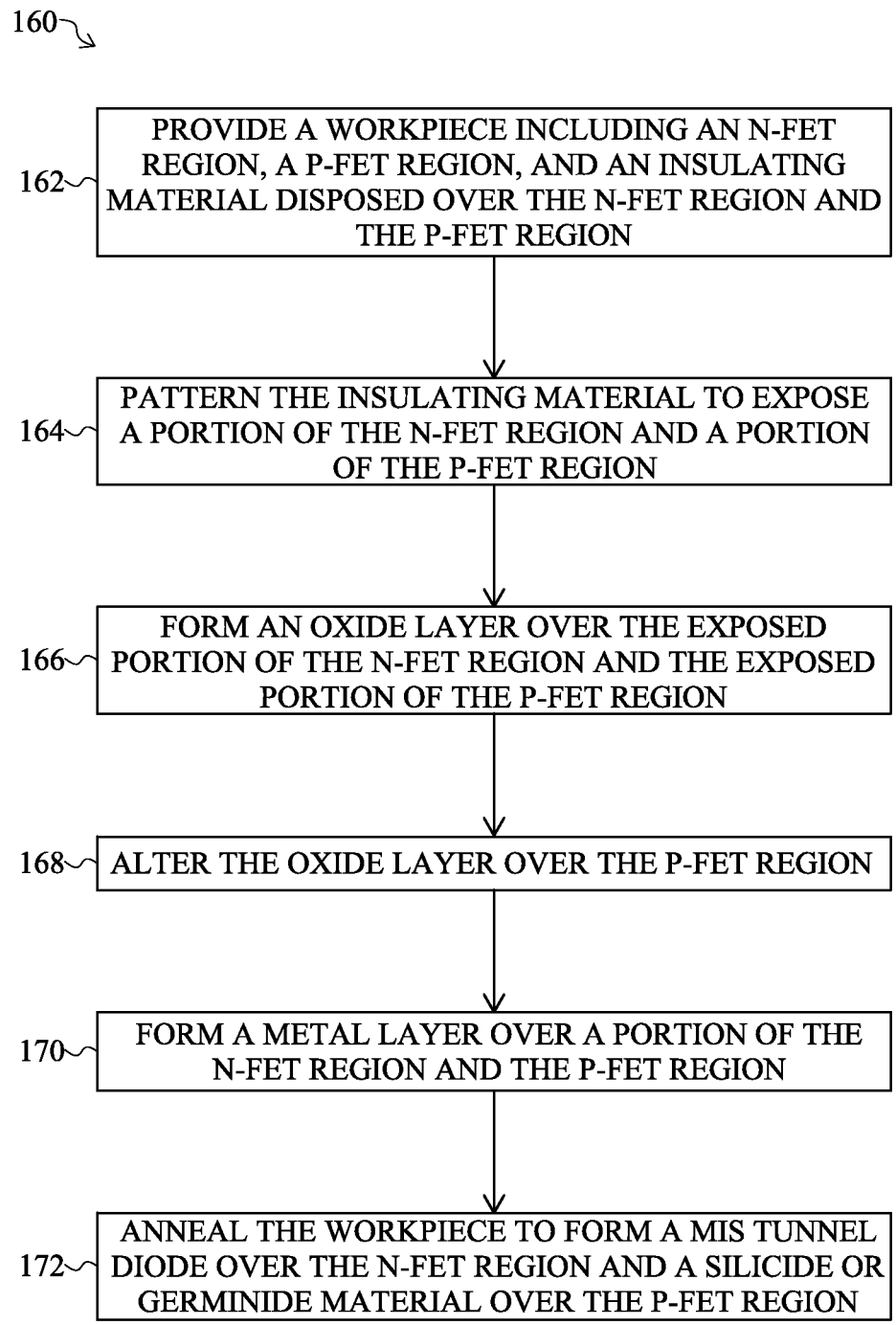
FIG. 14 is a flow chart of a method of manufacturing a semiconductor device in accordance with some embodiments.

FIG. 14 is a flow chart 160 of a method of manufacturing a semiconductor device 100 in accordance with some embodiments. In step 162, a workpiece 102 (see also FIG. 8) is provided that includes an N-FET region 104, a P-FET region 106, and an insulating material 112 disposed over the N-FET region 104 and the P-FET region 106. In step 164, the insulating material 112 is patterned to expose a portion of the N-FET region 104 and a portion of the P-FET region 106. An oxide layer 120 is formed over the exposed portion of the N-FET region 104 and the exposed portion of the P-FET region 106 in step 166 (see FIG. 9). The oxide layer 120 over the exposed portion of the P-FET region 106 is altered in step 168 (see FIG. 10). In step 170, a metal layer 124 is formed over a portion of the N-FET region 104 and the P-FET region 106. In step 172, the workpiece 102 is annealed to form a metal-insulator-semiconductor (MIS) tunnel diode 125 over the N-FET region 104 and a silicide or germinide material 126 over the P-FET region 106 (see also FIG. 12).

Embodiments of the present disclosure include methods of forming or manufacturing semiconductor devices 100, and also include semiconductor devices 100 that are manufactured using the methods described herein.

Advantages of embodiments of the disclosure include providing novel manufacturing process flows for forming MIS tunnel diodes 125 on N-FETs 134 and silicide or germinide on P-FETs 136. The process flows provide low-cost, manufacturing-friendly approaches to achieve low contact resistance at both N-FET and P-FET S/D regions 114 and 116, which also results in improved yields. Some of the process flows comprise simplified approaches to achieve a low contact resistance $R_{csd}$ at both the N-FET S/D region 114 and the P-FET S/D region 116, by simultaneously forming an MIS tunnel diode 125 at the N-FET 134 and forming a silicide or germinide 126 at the P-FET 136 having a SiGe or Ge S/D region 116. The novel process flows can be extended to or also implemented in semiconductor devices having Ge for a P-FET device 136 S/D region 116 and III-V materials for an N-FET device 134 S/D region 114. The process flows can be extended to Ge/SiGe/III-V device structures, for example. The MIS tunnel diode 125 coupled to the S/D region 114 of the N-FET 134 eliminates or reduces Fermi-level pinning (FLP) and results in reduced Schottky barrier height (SBH). In some embodiments, the metal layer 124 including a Ti pad material and the oxide layer 120 comprising $TiO_2$ formed by PVD with Ti vacuum oxidation results in improved current conduction and good thermal stability. Furthermore, the novel semiconductor device 100 structures and designs are easily implementable in manufacturing process flows.

In accordance with some embodiments of the present disclosure, a method of manufacturing a semiconductor device includes providing a workpiece including an N-FET region, a P-FET region, and an insulating material disposed over the N-FET region and the P-FET region. The insulating material is patterned to expose a portion of the N-FET region and a portion of the P-FET region. The method includes forming an oxide layer over the exposed portion of the N-FET region and the exposed portion of the P-FET region, altering the oxide layer over the P-FET region, and forming a metal layer over a portion of the N-FET region and the P-FET region. The workpiece is annealed to form an MIS tunnel diode over the N-FET region and a silicide or germinide material over the P-FET region.

In accordance with other embodiments, a method of manufacturing a semiconductor device includes providing a workpiece including an N-FET region, a P-FET region, and an insulating material disposed over the N-FET region and the P-FET region. The method includes patterning the insulating material to expose a source or drain region of the N-FET region and a source or drain region of the P-FET region, and forming a layer of $TiO_2$ over the exposed source or drain region of the N-FET region and the exposed source or drain region of the P-FET region. A portion of the layer of $TiO_2$ is removed from over the exposed portion of the P-FET region, and a metal layer is formed over a portion of the patterned insulating material, the N-FET region and the P-FET region. The method includes annealing the workpiece to form an MIS tunnel diode over the source or drain region of the N-FET region and a silicide or germinide material over the source or drain region of the P-FET region.

In accordance with yet other embodiments, a semiconductor device includes an N-FET disposed over a workpiece, the N-FET including a source or drain region and an MIS tunnel diode disposed over the source or drain region, wherein the MIS tunnel diode includes a metal comprising Ti and an insulator comprising $TiO_2$. The semiconductor device includes a p-type FET (P-FET) disposed over the workpiece proximate the N-FET, wherein the P-FET includes a source or drain region including a Ti silicide or Ti germinide disposed over a surface thereof.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece including an n-type field effect transistor (N-FET) region, a p-type FET (P-FET) region, and an insulating material disposed over the N-FET region and the P-FET region;
    patterning the insulating material to expose a first portion of the N-FET region and a second portion of the P-FET region;
    forming an oxide layer over the first portion of the N-FET region and the second portion of the P-FET region;
    altering the oxide layer on the second portion of the P-FET region and not altering the oxide layer on the first portion of the N-FET region;
    forming a metal layer over the first portion of the N-FET region and the second portion of the P-FET region;
    annealing the workpiece so that the metal layer reacts with a material on the second portion of the P-FET region to form a metal compound but does not react with the first portion of the N-FET region; and
    forming a conductive layer over the first portion of the N-FET region and the second portion of the P-FET region, the metal layer being interposed between the oxide layer and the conductive layer over the first portion of the N-FET region.

2. The method according to claim 1, wherein forming the oxide layer comprises forming $TiO_2$.

3. The method according to claim 1, wherein forming the oxide layer comprises a plasma oxidation process, a rapid thermal oxidation (RTO) process, or an in-situ steam generation (ISSG) process.

4. The method according to claim 1, wherein forming the oxide layer comprises forming an oxide having a thickness of about 5 Å to about 100 Å.

5. The method according to claim 1, wherein altering the oxide layer over the second portion of the P-FET region comprises damaging the oxide layer using a cleaning process.

6. The method according to claim 5, wherein damaging the oxide layer comprises forming a plurality of holes in the oxide layer.

7. The method according to claim 1, wherein altering the oxide layer over the second portion of the P-FET region comprises removing the oxide layer.

8. The method according to claim 1, further comprising simultaneously forming a MIS tunnel diode over the N-FET region and forming a silicide or germinide material over the P-FET region.

9. The method according to claim 1, wherein a source or drain region of the N-FET region comprises a first material, wherein a source or drain region of the P-FET region comprises a second material, the second material being different than the first material, wherein forming the oxide layer comprises forming a first oxide layer comprising an oxide of the first material over the first portion of the N-FET region, and wherein forming the oxide layer comprises forming a second oxide layer comprising an oxide of the second material over the second portion of the P-FET region.

10. A method of manufacturing a semiconductor device, the method comprising:
    providing a workpiece including an n-type field effect transistor (N-FET) region, a p-type FET (P-FET) region, and an insulating material disposed over the N-FET region and the P-FET region;
    patterning the insulating material to expose a first source or drain region of the N-FET region and a second source or drain region of the P-FET region, thereby forming a patterned insulating material;
    forming a layer of $TiO_2$ over the first source or drain region of the N-FET region and the second source or drain region of the P-FET region;
    removing a portion of the layer of $TiO_2$ from over the second source or drain region of the P-FET region and not removing the layer of $TiO_2$ on the first source or drain region of the N-FET region;

forming a metal layer over a portion of the patterned insulating material, the N-FET region and the P-FET region;

annealing the workpiece so that the metal layer reacts with the second source or drain region of the P-FET region to form a metal compound but does not react with the first source or drain region of the N-FET region; and forming a conductive layer over the first source or drain region of the N-FET region and the second source or drain region of the P-FET region, the metal layer being interposed between the layer of $TiO_2$ and the conductive layer over the first source or drain region of the N-FET region.

11. The method according to claim 10, wherein annealing the workpiece comprises a rapid thermal anneal (RTA) at a temperature of about 300 degrees C. to about 1,000 degrees C. for about 0.01 second to about 10 seconds, or wherein annealing the workpiece comprises a millisecond (ms) anneal at a temperature of about 500 degrees C. to about 1,200 degrees C. for about 1 to about 2.5 ms.

12. The method according to claim 10, wherein forming the metal layer comprises forming a first layer of Ti and forming a second layer of TiN over the first layer of Ti.

13. The method according to claim 12, wherein forming the first layer of Ti comprises forming a first layer of Ti having a thickness of about 5 Å to about 250 Å, and wherein forming the second layer of TiN comprises forming a second layer of TiN having a thickness of about 5 Å to about 100 Å.

14. The method according to claim 10, wherein forming the layer of $TiO_2$ comprises forming the layer of $TiO_2$ by physical vapor deposition (PVD).

15. The method according to claim 10, wherein forming the layer of $TiO_2$ comprises depositing Ti during a vacuum break induced oxidation process.

16. The method according to claim 10, wherein forming the layer of $TiO_2$ further comprises forming the layer of $TiO_2$ over a top surface of the insulating material and sidewalls of the patterned insulating material; wherein the method further comprises disposing a layer of photoresist over the layer of $TiO_2$ and removing the layer of photoresist from over the layer of $TiO_2$ over the P-FET region; wherein removing the portion of the layer of $TiO_2$ comprises etching the layer of $TiO_2$ using the layer of photoresist as an etch mask, removing the layer of $TiO_2$ from the top surface of the insulating material in the P-FET region and removing the portion of the layer of $TiO_2$ from over the second source or drain region of the P-FET region; and wherein the method further comprises removing the layer of photoresist.

17. A method of manufacturing a semiconductor device, the method comprising:

forming a first source/drain region in an N-region of a substrate;

forming a second source/drain region in a P-region of the substrate;

forming an oxide layer over a portion of the first source/drain region and over a portion of the second source/drain region;

altering the oxide layer over the portion of the second source/drain region and not altering the oxide layer on the portion of the first source/drain region;

forming a metal layer over the portion of the first source/drain region and over the portion of the second source/drain region;

performing an annealing step to cause the metal layer to react with the portion of the second source/drain region to form a material selected from the group consisting of silicides and germinides over the portion of the second source/drain region, wherein the metal layer does not react with the portion of the first source/drain region; and forming a conductive layer over the portion of the first source/drain region and over the portion of the second source/drain region, at least a portion of the oxide layer being interposed between the first source/drain region and the conductive layer.

18. The method of claim 17, wherein the step of altering the oxide layer over the portion of the second source/drain region includes removing the oxide layer over the portion of the second source/drain region.

19. The method of claim 17, wherein the step of altering the oxide layer over the portion of the second source/drain region includes forming holes in the oxide layer over the portion of the second source/drain region.

20. The method of claim 17, wherein the step of altering the oxide layer over the portion of the second source/drain region includes exposing the oxide layer to a wet cleaning process that damages the oxide layer over the portion of the second source/drain region.

* * * * *